(12) United States Patent
Kuge et al.

(10) Patent No.: US 7,263,679 B2
(45) Date of Patent: Aug. 28, 2007

(54) SEMICONDUCTOR INTEGRATED CIRCUIT DEVICE WITH BOUNDARY SCAN TEST AND DESIGN AUTOMATION APPARATUS, BOUNDARY SCAN TEST METHOD AND PROGRAM

(75) Inventors: Hiroyoshi Kuge, Kanagawa (JP); Yoshihiro Ohara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 266 days.

(21) Appl. No.: 10/786,552

(22) Filed: Feb. 26, 2004

(65) Prior Publication Data

US 2004/0172605 A1   Sep. 2, 2004

(30) Foreign Application Priority Data

Feb. 27, 2003   (JP) .............................. 2003-051469

(51) Int. Cl.
*G06F 17/50* (2006.01)
(52) U.S. Cl. .......................................... 716/10; 716/11
(58) Field of Classification Search ...................... None
See application file for complete search history.

(56) References Cited

U.S. PATENT DOCUMENTS

| 5,509,019 | A | | 4/1996 | Yamamura |
| 5,983,376 | A | * | 11/1999 | Narayanan et al. ......... 714/726 |
| 6,145,116 | A | | 11/2000 | Tawada |
| 6,564,362 | B2 | * | 5/2003 | Osaki et al. .................. 716/10 |
| 6,983,436 | B2 | * | 1/2006 | Amekawa ....................... 716/5 |
| 7,000,163 | B1 | * | 2/2006 | Dirks et al. ................. 714/727 |
| 2002/0004929 | A1 | | 1/2002 | Osaki et al. |
| 2004/0006754 | A1 | * | 1/2004 | Sonohara ....................... 716/8 |

FOREIGN PATENT DOCUMENTS

| JP | 6-160480 | | 6/1994 |
| JP | 7-176579 | | 7/1995 |
| JP | 10144796 | | 5/1998 |
| JP | 2000022081 | | 1/2000 |
| JP | 2002-26129 | | 1/2002 |
| JP | 2004047516 A | * | 2/2004 |
| JP | 2004172373 A | * | 6/2004 |

OTHER PUBLICATIONS

Jones, T.R.: "JTAG Clock & Control Signal Distribution Scheme" Motorola Technical Developments, Motorola Inc. Schaumburg, Illinois, US, vol. 18, Mar. 1, 1993, pp. 44-49.

* cited by examiner

*Primary Examiner*—Leigh M. Garbowski
(74) *Attorney, Agent, or Firm*—Young & Thompson

(57) ABSTRACT

An area for layout of a plurality of I/O cells (called an "I/O area") is provided in the peripheral portion of a chip and signal wirings for transferring test signals to the I/O cells are provided in the layout direction of the I/O cells. At least one empty cell provided in the I/O area at a position where I/O cells are not provided has a repeater circuit which constitutes a transfer path for the test signal. The repeater circuit receives the test signal and outputs the test signal. This structure provides a suitable semiconductor integrated circuit device adaptable for an ASIC or the like, which can adjust the delay of a test signal to be transferred along the chip's peripheral portion by suppressing an increase in the delay and degradation in waveform depression.

7 Claims, 10 Drawing Sheets

SEMICONDUCTOR INTEGRATED CIRCUIT DEVICE WITH BOUNDARY SCAN TEST AND DESIGN AUTOMATION APPARATUS, BOUNDARY SCAN TEST METHOD AND PROGRAM

BACKGROUND OF THE INVENTION

1. Field of the Invention

The present invention relates to a semiconductor integrated circuit device, and, more particularly, to a semiconductor integrated circuit device, and a design automation method, apparatus and program which employ a test facilitating design technology.

2. Description of the Related Art

Boundary scan (JTAG) which is one scheme for test facilitating design is standardized in 1990 as described in IEEE std 1149.1-1990 Standard Test Access Port and Boundary-Scan Architecture and is a test method mainly aiming at checking wiring connection between LSIs.

FIG. 1 is a diagram illustrating the schematic structure of a typical boundary-scan circuit (see, for example, "Fundamentals and Application of JTAG Test" by Kazumi Sakamaki, p 24, FIG. 2-2, CQ Publication Co., Ltd., Dec. 1, 1998). A boundary-scan register has a multiplexer M1, a flip-flop F1, a flip-flop F2, and a multiplexer M2. The multiplexer M1 receives a serial signal input SI and a signal input PI and selects the input SI in response to a Shift_DR command (signal 5). The flip-flop F1 samples the output of the multiplexer M1 according to a shift clock and outputs a sampled signal as SO. The flip-flop F2 samples the output of the flip-flop F1 according to an update clock (Update_DR) and outputs a sampled signal. The multiplexer M2 receives the output of the flip-flop F2 and the signal PI and outputs one of the inputs to a terminal PO based on a mode signal MODE. In case of an input cell, the terminal PI is connected to the input pin and the terminal PO to an internal circuit. In case of an output cell, the terminal P1 is connected to the internal circuit and the terminal PO to the output pin. An input/output cell takes such a structure as to have two circuits each as shown in FIG. 2 which are switched from one to the other in accordance with the input and the output. The serial input terminal SI receives TDI (Test Data Input) or an output TDO (Test Data Output) of the boundary-scan circuit at the previous stage.

In the boundary-scan test, a board tester executes a board test by inputting and outputting test data in such a way as to sequentially connect shift registers inside a boundary-scannable device on a board to be tested. The signal TDI from the board tester is connected to the TDI pin of the boundary-scannable device, is output from the TDO pin of the device, and is then connected to the TDI pin of a boundary-scannable device at the next stage. The signal TDI is sequentially connected to all boundary-scannable devices on the board in this manner. The TDO pin of the last device is connected to the TDO pin of the board tester. Signals TCK and TMS from the board tester are connected to all the boundary-scannable devices in the form of a bus. The boundary-scannable device has a boundary-scan register (see FIG. 1) provided between the external I/O pin and the internal logic, and the boundary-scan register forms a scan chain between the TDI pin and the TDO pin. The boundary-scannable device has terminals TCK (test clock input terminal), TMS (test mode select input terminal), TDI (test data input terminal), TDO (test data output terminal) and TRST (test reset terminal) as external control terminals to connect the boundary-scan control circuit in the LSI to an external unit, and is controlled by signals TCK, TMS and so forth. The boundary-scannable device includes a TAP (Test Access Port) controller, which is a state machine to control the flow of a test command and data to the boundary-scan circuit, an instruction register which holds an instruction code loaded from the TDI terminal, and an instruction decoder which generates a test control signal from the instruction loaded into the instruction register. The boundary-scannable device has the boundary-scan register, a bypass register and a user definition register as data registers to be connected to the TDI terminal and TDO terminal.

FIG. 2 is a schematic diagram illustrating a typical conventional example of the layout in an ASIC (Application Specific IC) device, paying attention to I/O cells. In the example shown in FIG. 2, three types of buffers A (11), B (12) and C (13) are laid out in the layout area (called "I/O area") between the external pins and an inner area 10 in the peripheral area of a chip 1. Each of those buffers 11, 12 and 13 has a boundary-scan cell structure including a boundary-scan register. Corner cells 14 which serve as test control circuits are provided at the four corners and a buffer 24 of each corner cell 14 enable wirings 31, 32 and 33 to transfer test signals. The wirings 31, 32 and 33 are global wirings running through the I/O cell area in the chip's peripheral portion over a plurality of I/O cells. The wirings 31, 32 and 33 are laid on a metal wiring layer on the top layer of the substrate and are connected via through holes and contacts to the gate electrodes, the drain terminals or so of elements which constitute boundary-scan circuits 21, 22, etc. in the I/O cells.

The operation of the chip shown in FIG. 2 is briefly discussed. In normal operation mode, an I/O cell serves as a buffer circuit which receives a signal applied to the input pin and supplies the signal to the internal circuit, or receives a signal from the internal circuit and outputs the signal from the output pin, or receives and outputs a signal at and from an I/O pin common to the input and output.

In test mode, the pins of the device are isolated from the internal circuit and test signals are supplied to the boundary-scan registers. Each boundary-scan register serves a shift register and outputs a signal input from the unillustrated TDI terminal to the unillustrated TDO terminal. In the example shown in FIG. 2, each I/O cell has such a structure as to include the control circuit 21, 22 or the like for the boundary-scan test and some I/O cells have buffers 23 for enabling the global wirings.

As fan-out adjustment of a test net which passes through the boundary-scan register, the following method (Japanese Patent Laid-Open No. 2002-26129) is known. According to the method, after the layout of I/O cells, I/O connection boundary-scan registers are laid out in empty areas near the I/O cells by priority before laying out an internal logic circuit or the like, an I/O control boundary-scan register is laid out at the midway point between the I/O connection boundary-scan registers or the side of the chip closer to the midway point, then buffer cells are laid out in test nets corresponding to the boundary-scan registers connected to the test control circuits before creating the layout and wiring patterns of cells which constitute other circuits, whereby fan-out adjustment between the test control circuits and the boundary-scan registers is executed with the minimum number of buffers inserted. Unlike the conventional method, the present invention inserts a buffer in an empty cell in the I/O area as will be apparent from the description of the present invention given later.

There is a design method for a signal propagation circuit which can uniquely determine the optimal circuit structure by independently determining and can facilitate the optimal design to minimize the delay time of the signal propagation circuit by independently determining the size and number of the inverters or buffers to be inserted (Japanese Patent Laid-Open No. 2001-290854).

With the structure shown in FIG. 2, however, the test circuits are arranged at the corners or so of a chip and test signals are supplied to the I/O cells from the test circuits. As the chip size increases, therefore, the wiring length becomes longer and the delay of the test signals increases because of factors, such as the wiring resistance and floating capacitance, thereby increasing the degree of waveform depression at a far end. This lowers the accuracy and reliability of the test.

Further, as the structure shown in FIG. 2 distributes the test signals from the test circuits located at the corners, delay adjustment cannot be carried out.

SUMMARY OF THE INVENTION

Accordingly, it is an object of the present invention to provide a suitable semiconductor integrated circuit device adaptable for an ASIC or the like, which can suppress an increase in the delay of a test signal to be transferred along the chip's peripheral portion and degradation in waveform depression and can ensure delay adjustment, and a method, apparatus and program for design automation of the semiconductor integrated circuit device.

A semiconductor integrated circuit device according to the first aspect of the present invention comprises & plural I/O cells provided in an I/O area in a peripheral portion of a chip that are to be connected to external pins; signal wirings which transfer a test signal to the I/O cells and are provided in the I/O area in a layout direction of the plurality of I/O cells; and at least one part of the I/O area where the signal wirings run and that does not include I/O cells has a repeater circuit therein that receives the test signal and outputs the test signal.

According to the present invention, the repeater circuit satisfies a delay condition of the test signal.

A design automation apparatus for a semiconductor integrated circuit according to the second aspect of the present invention comprises: a memory unit which stores I/O cell layout position information, I/O cell size information, I/O cell test terminal information, technology information including design information, and information on a repeater circuit to be laid out in an empty cell for ea.ch type of I/O cell on a chip which are to be connected to external pins; a computing section which computes a wiring length of a sub net between adjoining I/O cells for test signals (called "test net") to be connected to an area for layout of I/O cells (called "I/O area") at a peripheral portion of a chip by referring to said I/O cell layout position information, I/O cell size information and I/O cell test terminal information in said memory unit and outputs said wiring length; a circuit simulator; a determining section which computes information at least on a wiring resistance and a capacitance for said sub net, causes said circuit simulator to execute circuit simulation to acquire a wiring delay of said sub net and waveform depression at an end of said sub net, and determines an optimal repeater circuit to be inserted in an empty cell where said sub net passes, based on said information on said repeater circuit stored in said memory unit in case where said wiring delay and waveform depression concerning said sub net are out of a predetermined range of allowance defined in said technology information; and a layout section which lays out an empty cell including said determined repeater circuit in said I/O area.

According to the design automation apparatus of the present invention, the determining section determines a repeater circuit may include means which performs control in such a way as to execute circuit simulation for a sub net divided by insertion of a selected repeater circuit to acquire a wiring delay and waveform depression concerning the divided sub net, determine whether the wiring delay and waveform depression concerning the divided sub net fall within the range of allowance defined in the technology information or not, and search for an optimal repeater circuit by selecting another repeater circuit or further dividing the sub net in case where the wiring delay and waveform depression do not fall within the range of allowance.

According to the third aspect of the present invention, there is provided a design automation method for a semiconductor integrated circuit using a computer having a memory unit which stores I/O cell layout position information, I/O cell size information, I/O cell test terminal information, technology information including design information, and information on a repeater circuit to be laid out in an empty cell for each type of I/O cell on a chip which are to be connected to external pins. The method comprises the steps of computing a wiring length of a sub net between adjoining I/O cells for test signals (called "test net") to be connected to an area for layout of I/O cells (called "I/O area") at a peripheral portion of a chip by referring to the I/O cell layout position information, I/O cell size information and I/O cell test terminal information in the memory unit and outputting the wiring length; computing information at least on a wiring resistance and a capacitance for the sub net, causing a circuit simulator to execute circuit simulation to acquire a wiring delay of the sub net and waveform depression at an end of the sub net; a step of determining an optimal repeater circuit to be inserted in an empty cell where the sub net passes, based on the information on the repeater circuit stored in the memory unit in case where the wiring delay and waveform depression concerning the sub net are out of a predetermined range of allowance defined in the technology information; and laying out an empty cell including the determined repeater circuit in the I/O area.

According to the design automation method of the present invention, the step of determining a repeater circuit may include the steps of performing control in such a way as to execute circuit simulation for a sub net divided by insertion of a selected repeater circuit to acquire a wiring delay and waveform depression concerning the divided sub net; and determining whether the wiring delay and waveform depression concerning the divided sub net fall within the range of allowance defined in the technology information or not, and searching for an optimal repeater circuit by selecting another repeater circuit or further dividing the sub net in case where the wiring delay and waveform depression do not fall within the range of allowance.

According to the fourth aspect of the present invention, there is provided a program for allowing a computer having a memory unit which stores I/O cell layout position information, I/O cell size information, I/O cell test terminal information, technology information including design information, and information on a repeater circuit to be laid out in an empty cell for each type of I/O cell on a chip, which are to be connected to external pins, to execute a first process of computing a wiring length of a sub net between adjoining I/O cells for test signals (called "test net") to be wired to an area for layout of I/O cells (called "I/O area") at a peripheral portion of a chip by referring to the I/O cell layout position information, I/O cell size information and I/O cell test terminal information in the memory unit and outputting the wiring length; a second process of computing information at least on a wiring resistance and a capacitance for the sub net, causing a circuit simulator to execute circuit simulation to acquire a wiring delay of the sub net and waveform depression at an end of the sub net; a third process of determining an optimal repeater circuit to be inserted in an empty cell where the sub net passes, based on the information on the repeater circuit stored in the memory unit in case where the wiring delay and waveform depression concerning the sub net are out of a predetermined range of allowance defined in the technology information; and a fourth process of laying out an empty cell including the determined repeater circuit in the I/O area.

The present invention has an advantage such that a semiconductor integrated circuit, such as ASIC, which is constructed by using the test facilitating design scheme can suppress a delay of a test signal and waveform depression caused by an empty cell and can ensure delay adjustment, thereby improving the reliability and precision of a test.

Further, as the present invention can permit connection of test nets and insertion of repeaters on the system side by merely laying out I/O cells based on the device specification at the time of designing a semiconductor integrated circuit device, the present invention has an additional advantage of reducing the design and development costs for test facilitating design and making it easier to cope with small production of multiple types of devices.

DETAILED DESCRIPTION OF THE PREFERRED EMBODIMENT

A preferred embodiment of the present invention is described below with reference to the accompanying drawings.

Figure 3:
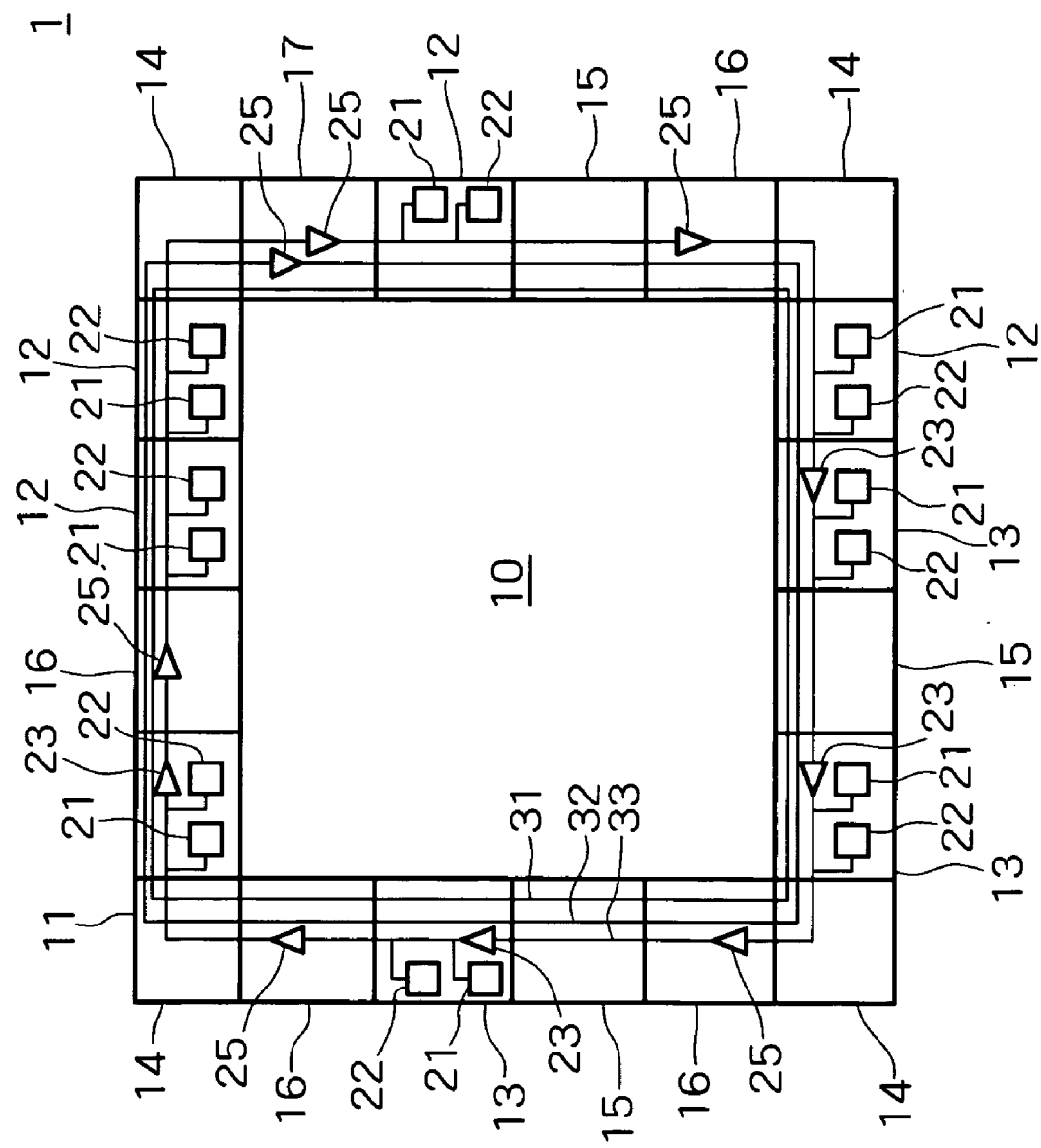
FIG. 3 is a diagram illustrating the structure of one embodiment of the present invention.

FIG. 3 is a diagram illustrating the schematic structure of a semiconductor integrated circuit according to one embodiment of the present invention. Referring to FIG. 3, empty cells each having a repeater circuit are adequately laid out in an empty cell area where no I/O cells are laid out in an I/O area in the peripheral portion of a chip where I/O cells are laid out in this embodiment. Specifically, wirings 31, 32 and 33 for transferring a test signal to a plurality of I/O cells in the I/O area are provided in the I/O area over a plurality of I/O cells in the layout direction of the I/O cells to form global wirings. Of those empty cells over which the wirings 31, 32 and 33 pass, an empty cell A 16 and an empty cell B 17 each having a repeater circuit 25 that constitute a transfer path for a test signal, receives the test signal and outputs the test signal are provided adequately.

In the embodiment, plural types of empty cells having repeater circuits different from one another in propagation delay time, drive performance, size or so are provided beforehand, so that the delay adjustment can be done in such a way as to meet design conditions by selectively laying out that repeater circuit which has the optimal propagation delay time and drive performance. This can improve the reliability and precision of a test.

Figure 2:
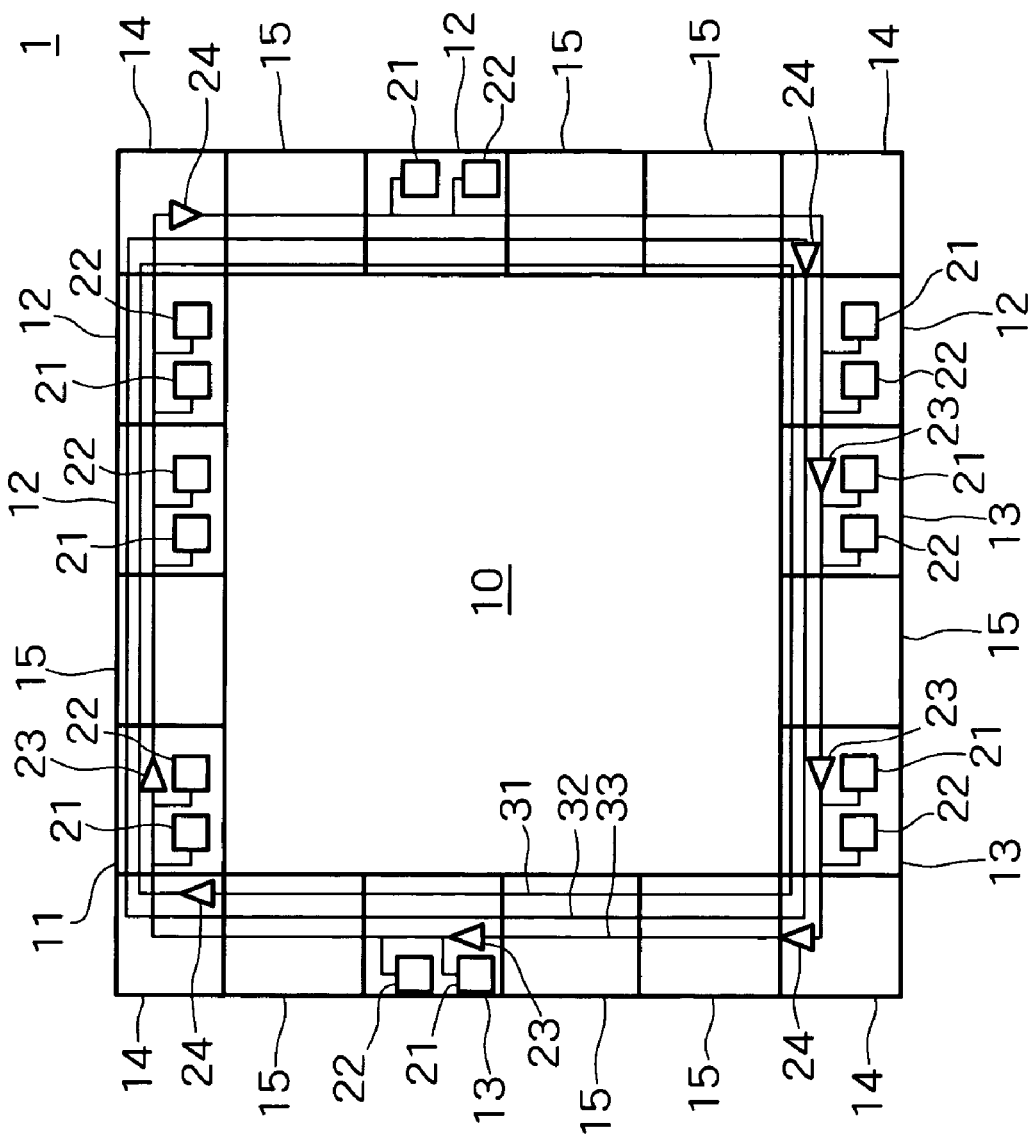
FIG. 2 is a diagram illustrating the layout of an I/O area of a conventional semiconductor integrated circuit.

An empty cell C 15 in FIG. 3 is a transit cell having no repeater, i.e., an empty cell where the global wirings 31, 32 and 33 pass by directly. The structure in FIG. 3 is basically the same as the structure shown in FIG. 2, except for the layout of the empty cells 16 and 17 having the optimal repeater circuit 25 in an empty area in the I/O area over which test signals 31, 32 and 33 pass. Reference numerals "21" and "22" in buffers (I/O cells) 11, 12 and 13 in FIG. 3, like those in FIG. 2, denote a test control circuit and device, such as a boundary-scan register. The elements 21 and 22 may be so designed as to be a boundary-scan register and a flip-flop for a scan path test both provided in a single I/O cell as will be described later. In this case, "21" and "22" respectively indicate the boundary-scan register and the flip-flop for a scan path test.

Figure 4:
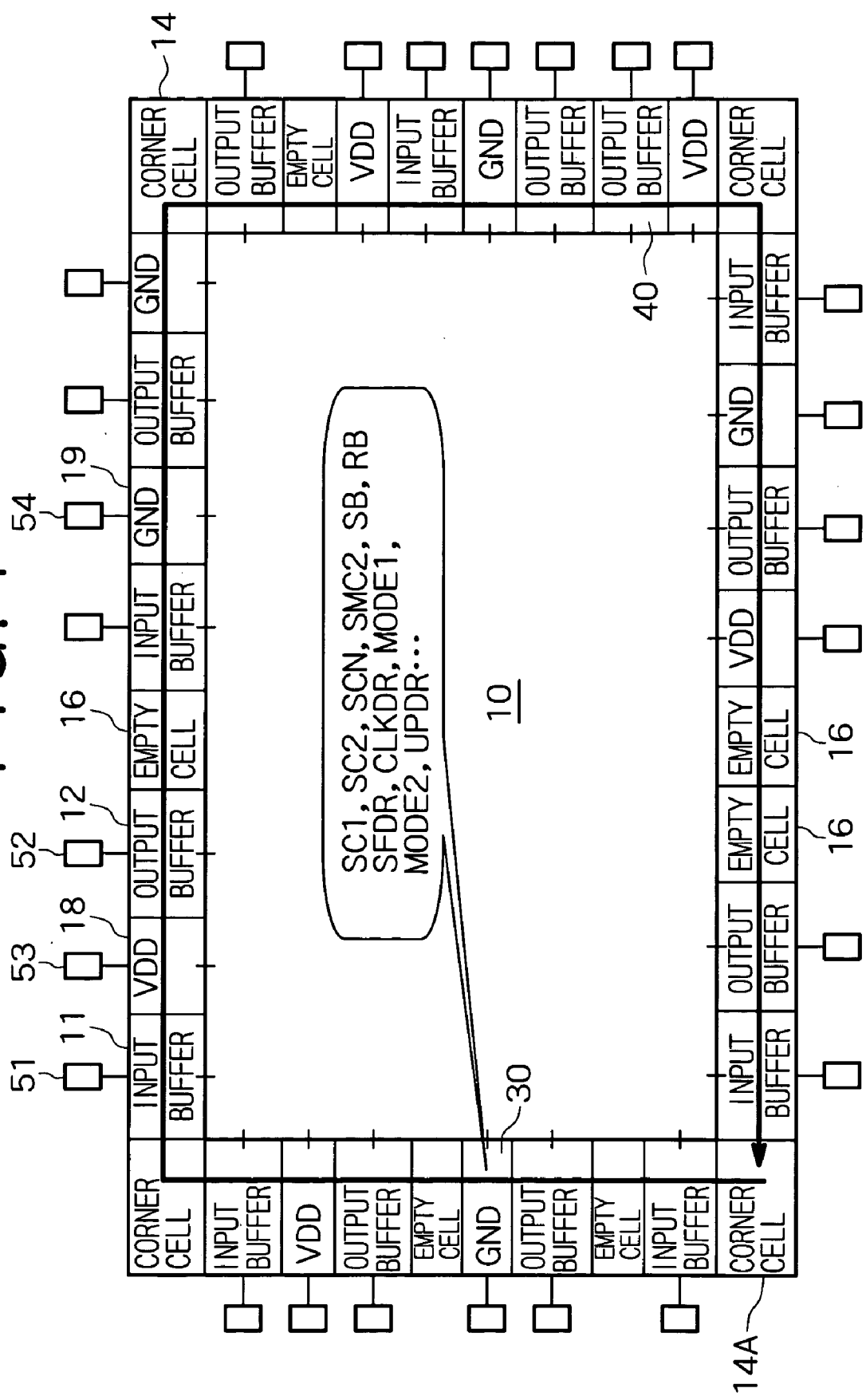
FIG. 4 is a diagram illustrating the structure of the embodiment.

The embodiment is discussed below more specifically and in detail. FIG. 4 is a diagram schematically illustrating a chip layout according to the embodiment of the present invention. In the embodiment, a test circuit, such as a boundary-scan circuit, is buried in advance in each I/O cell and a test net is constructed in such a way that wiring connection is made by an automatic wiring tool by laying those I/O cells at the time of designing a device.

Referring to FIG. 4, an I/O area 40 in the peripheral portion of a chip 1 is provided with, as I/O cells, an input buffer 11 which connects to an input pin 51 and an output buffer 12 which connects to an output pin 52, and is further provided with a power supply block (cell) 18 which connects to a power supply terminal (VDD) 53 and ground (GND) block 19 which connects to a GND terminal 54. Corner cells 14 which constitute test control circuits are provided at the corners of the chip. The chip 1 is further provided with boundary-scan terminals (TDI, TMS, TCK, TDO, TRST) and scan path test terminals (SIN, SCK, SOT) none of which are shown. Empty cells 15 each having a repeater circuit to compensate for signal delay of a test net are provided in an empty area in the I/O area 40 where the I/O cells and cells, such as power supply block and OND block, are not provided.

Signal wirings (test net) 30 for test control signals SC1, SC2, SCN, SMC2, SFDR, CLKDR, MODE1, etc. are global wirings provided in the I/O area 40 over a plurality of I/O cells along the sides of the chip. When the layout of the I/O cells and the layout of the empty cells are decided, the signal wirings 30 are automatically connected to I/O cell test terminals based on terminal information and layout information by a wiring tool.

Each of repeater circuits which are adequately laid out in the empty cells by which the test net passes comprises an initial-stage inverter which receives a signal and even stages of inverters which receive the output of the initial-stage inverter and constitute an output stage. There are plural types of repeater circuits each of which is constituted by cascade-connecting even stages of CMOS inverters and which differ from one another in the current driver performance (the ratio of the gate width of a transistor to the gate length (W/L ratio), etc.) of the output stage and propagation delay time (tpd) or so. The optimal repeater circuit which satisfies conditions concerning the required propagation delay time and the drive performance of the output stage is automatically selected. This structure is one of the features of the present invention.

Figure 5:
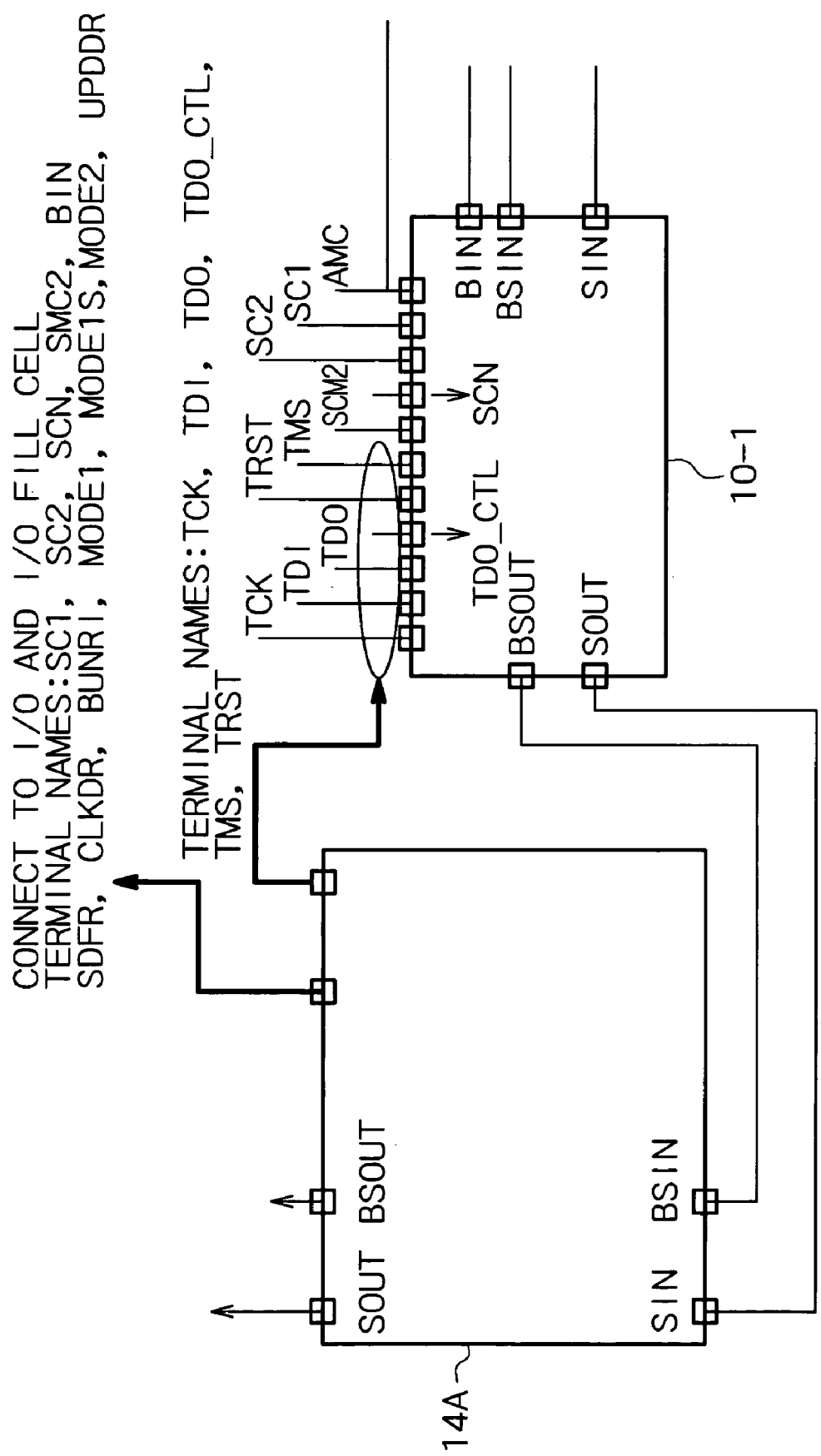
FIG. 5 is a diagram for explaining a corner cell in FIG. 4 and test signals to be transferred to an I/O area.

FIG. 5 is a diagram for one example of the structure of a corner cell 14A in FIG. 4. The corner cell 14A has a serial input SIN and a serial output SOUT for a scan path test for an internal circuit, and a serial input BSIN and a serial output BSOUT to be used in a boundary-scan test. The corner cell 14A supplies clocks (2-phase scan clocks) SC1 and SC2, controls signals SCM2, SB, RB, SCN and Shift_DR (SFDR), a shift clock signal CLKDR, an update clock Update_DR (UPDR), a mode signal MODE, etc. to the I/O cells and empty cells. The test signals TCK, TDI, TDO, TMS and TRST are connected to the terminals of a test control circuit 10-1. FIGS. 4 and 5 illustratively show some of the test control signals to which the present invention is not limited.

Figure 6:
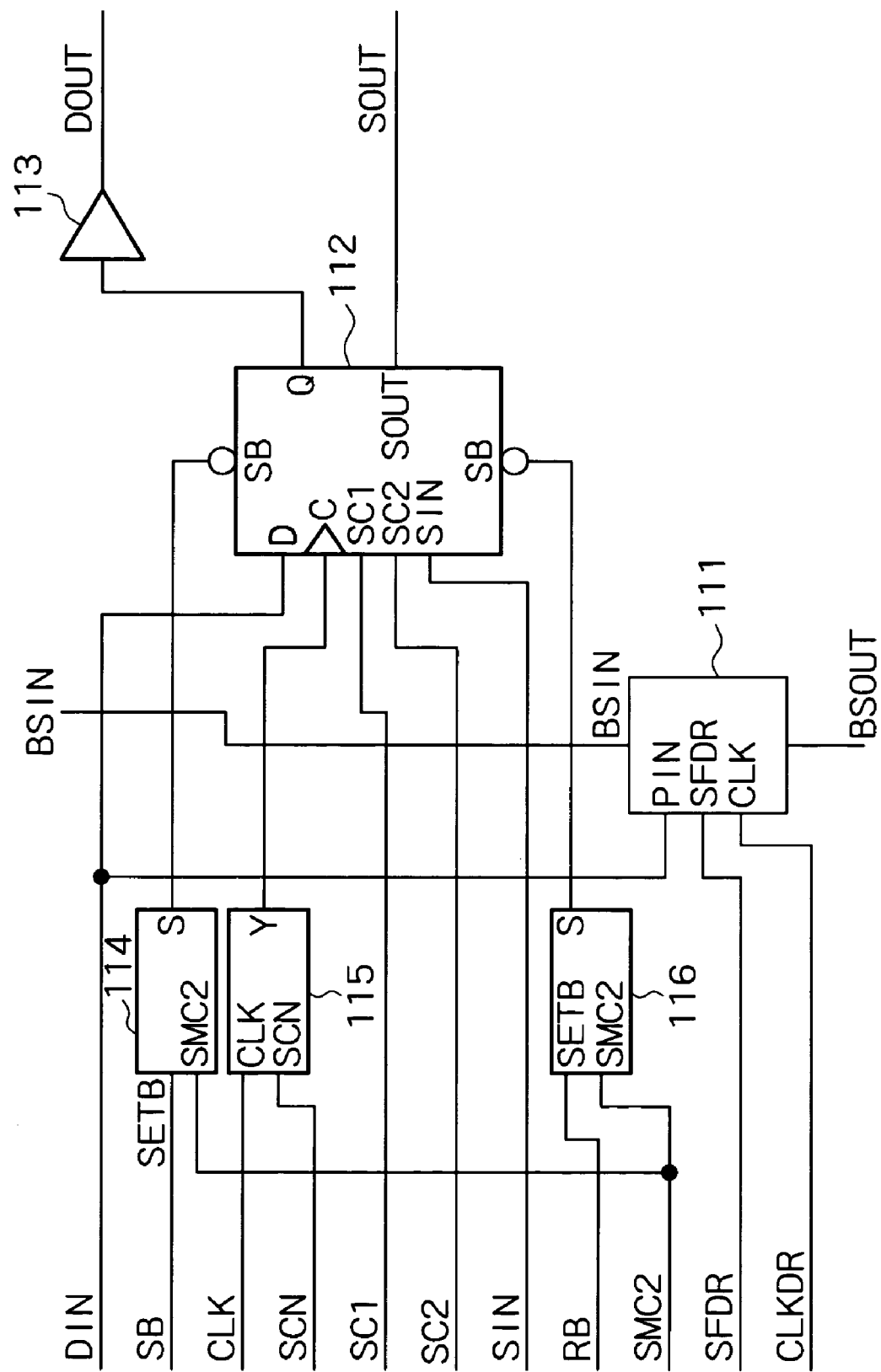
FIG. 6 is a diagram illustrating the structure of an input buffer according to the embodiment.

FIG. 6 is a diagram showing one example of the structure of the input buffer 11 in FIG. 4. A boundary-scan register 111 receives a parallel input signal PIN, a serial input signal BSIN, shift data register (Shift_DR) signal SFDR and the shift clock signal CLKDR and outputs a serial output BSOUT. The serial output BSOUT is either supplied to the serial input BSIN of the next cell or output from the TDO pin of the device in case of the last-stage cell in the scan chain in the device. A scan flip-flop circuit 112 is a known scan flip-flop circuit which has a data terminal D to receive data DIN from an input pin (the output of an unillustrated input buffer), a clock terminal C to receive a sampling clock for sampling a signal from the data terminal D at the rising edge, a normal output terminal Q, 2-phase scan clock terminals SC1 and SC2, a serial input terminal SIN, a serial output terminal SOUT, a reset terminal RB and a set terminal SB. A logic circuit 114 receives SB and SMC2 which are test control signals and performs such control as to enable the set terminal SB of the scan flip-flop circuit 112 to set the output of the set terminal SB to logic 1, for example, when the signal SB is at a low level and the signal SMC2 is at a high level. A logic circuit 116 receives RB and SMC2 which are test control signals and performs such control as to enable the reset terminal RB of the scan flip-flop circuit 112 to reset the output of the reset terminal RB to logic 0 when the signal RB is at a low level and the signal SMC2 is at a high level. The logic circuits 114 and 116 may each be constituted by an SR flip-flop which sets its output terminal S to a low level when its terminal SETB is at a low level and sets the output terminal S to a high level when its terminal SMC2 is at a low level. A circuit 115 is designed in such a way as to supply a normal clock signal CLK to the clock terminal C of the scan flip-flop circuit 112 when its terminal SCN is active.

The operation of the input buffer illustrated in FIG. 6 is briefly described. In normal operation mode, the data signal DIN (input data from the input pin) is sampled by the scan flip-flop circuit 112 at the rising edge of the clock signal CLK and is output to a corresponding internal circuit as DOUT from a buffer 113. In scan path test mode (when SCN=low level), the clock signal CLK is masked by the circuit 115 so that it is not supplied to the clock terminal C of the scan flip-flop circuit 112. The scan flip-flop circuit 112 latches the serial input SIN according to clocks CK1 and CK2 and outputs the latched signal to the serial output terminal SOUT. In boundary-scan test mode, the boundary-scan register 111 receives the signal BSIN and outputs it as BSOUT under the control of an unillustrated TAP controller.

As one modification of the circuit shown in FIG. 6, the data input DIN may be directly output from the buffer 113 as DOUT without going through the scan flip-flop circuit 112 and the serial input SIN may be output from another buffer as SOUT. In this case, the terminals SMC2 of the circuits 114 and 116 are fixed at a low level, the terminal SCN of the circuit 115 is fixed at a low level, and the terminals D, SC1, SC2 of the scan flip-flop circuit 112 are fixed at a low level.

Figure 1:
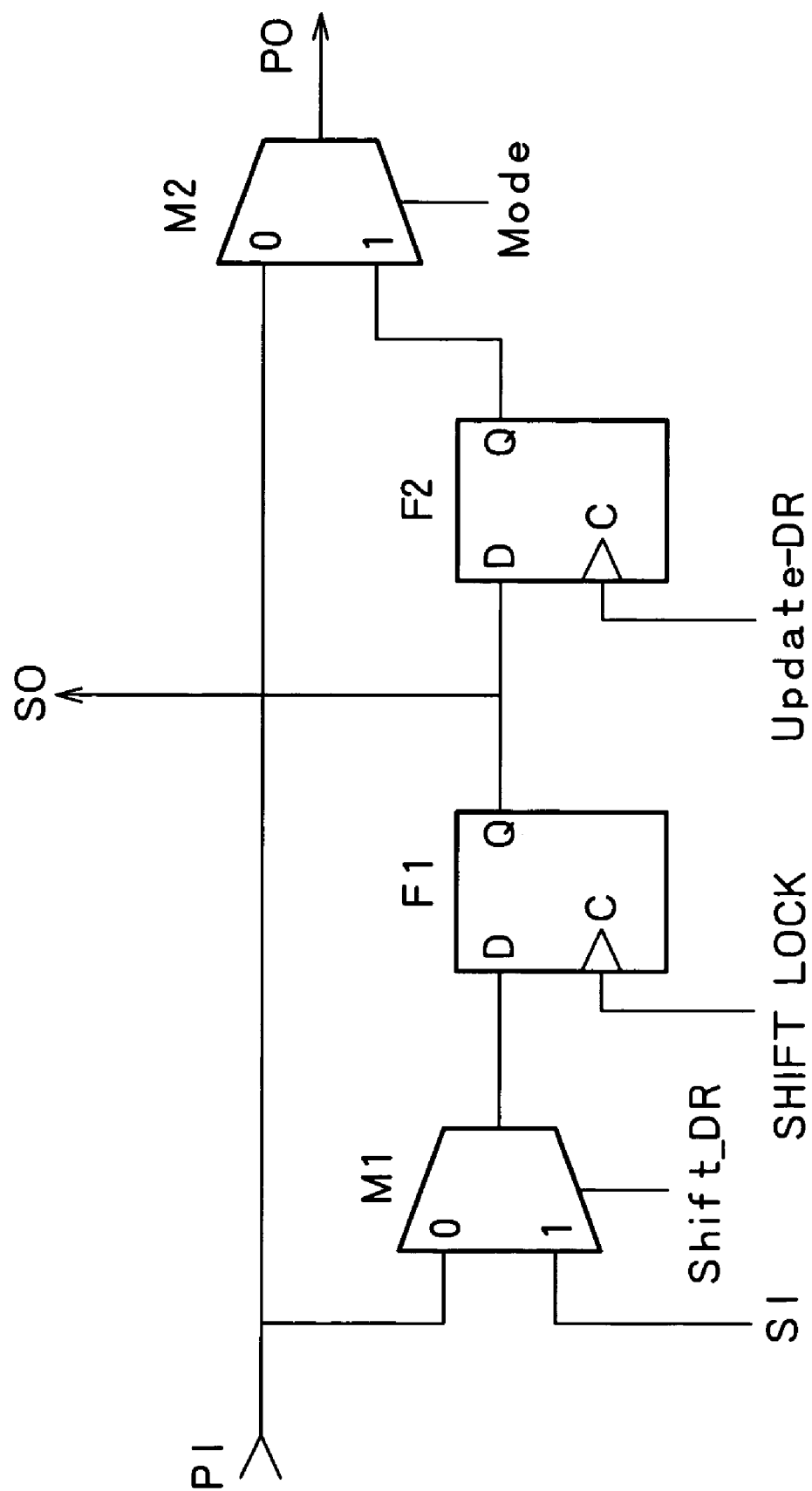
FIG. 1 is a diagram illustrating the structure of a conventional boundary-scan cell.
Figure 7:
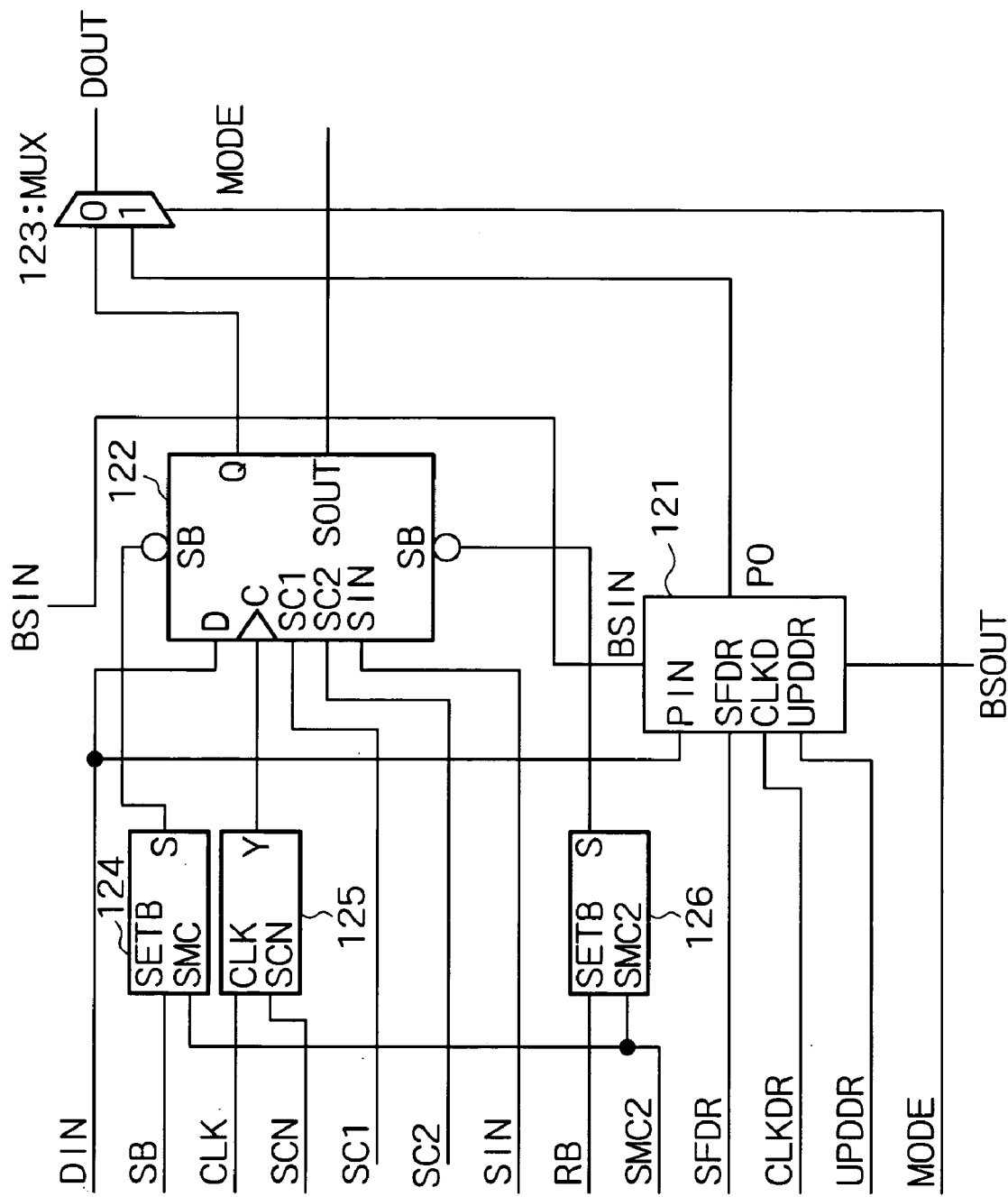
FIG. 7 is a diagram illustrating the structure of an output buffer according to the embodiment.

FIG. 7 is a diagram illustrating one example of the structure of the output buffer 12. A boundary-scan register 121 receives the parallel input signal PIN (data input DIN from the internal circuit), serial input signal BSIN, shift data register (Shift_DR) signal SFDR and shift clock signal CLKDR, outputs the serial output BSOUT and outputs data, selected by a multiplexer (M2 in FIG. 1) from a parallel output terminal P0. The output BSOUT is either supplied to the serial input BSIN of the next cell or output from the TDO pin of the device in case of the last-stage cell in the scan chain in the device. A scan flip-flop circuit 122 is a known scan flip-flop circuit which has a data terminal D to receive data DIN from an internal circuit, a clock terminal C to receive a sampling clock for sampling a signal from the data terminal D at the rising edge, a normal output terminal Q, 2-phase scan clock terminals SC1 and SC2, a serial input terminal SIN, a serial output terminal SOUT, a reset terminal RB and a set terminal SB. A logic circuit 124 receives SB and SMC2 which are test control signals and performs such control as to enable the set terminal SB of the scan flip-flop circuit 112 to set the output of the set terminal SB to logic 1, for example, when the signal SB is at a low level and the signal SMC2 is at a high level. A logic circuit 126 receives RB and SMC2 which are test control signals and performs such control as to enable the reset terminal RB of the scan flip-flop circuit 122 to reset the output of the reset terminal RB to logic 0 when the signal RB is at a low level and the signal SMC2 is at a high level. The logic circuits 124 and 126 may each be constituted by an SR flip-flop which sets its output terminal S to a low level when its terminal SETB is at a low level and sets the output terminal S to a high level when its terminal SMC2 is at a low level. A circuit 125 is designed in such a way as to supply a normal clock signal CLK to the clock terminal C of the scan flip-flop circuit 112 when its terminal SCN is active. A multiplexer 123 receives a data output Q (parallel output) of the scan flip-flop circuit 122 and a parallel output P0 of the boundary-scan register 121, and outputs the data output Q of the scan flip-flop circuit 122 as DOUT when the mode signal MODE has a logic 0 and outputs the parallel output PQ of the scan boundary-scan register 121 as DOUT when the mode signal MODE has a logic 1.

The operation of the output buffer illustrated in FIG. 7 is briefly described. In normal operation mode, the data DIN is latched by the scan flip-flop circuit 122 and output as DOUT. In scan path test mode, the scan flip-flop circuit 122 samples the serial input SIN by means of a master-slave latch circuit which is controlled according to scan clocks SC1 and S02, and outputs the serial output SOUT. In boundary-scan test mode, the signal BSIN is output as BSOUT under the control of the unillustrated TAP controller. When the mode signal MODE has logic 1, a flip-flop F2 (see FIG. 1) of the boundary-scan register 121 is output as DOUT.

As one modification of the circuit shown in FIG. 7, the data input DIN may be directly output as DOUT without going through the scan flip-flop circuit 122 and the serial input SIN may be output from another buffer as SOUT. In this case, the terminals SMC2 of the circuits 124 and 126 are fixed at a low level, the terminal SCN of the circuit 125 is fixed at a low level, and the terminals D, SC1, SC2 of the scan flip-flop circuit 122 are fixed at a low level.

Further modifications of the input buffer and output buffer respectively shown in FIGS. 6 and 7 may be constructed to have a test control signal and a switch control circuit so that the data signal DIN from the input pin (user pin) and output data DOUT to the output pin (user pin) are used in the input and output of the test signal for the internal circuit.

For I/O cells for plural types of buffers including an input/output buffer in addition to the above-described input buffer and output buffer, cell sizes and test terminal information are registered and a test net of SC1, SC2, SB, RB, SFDR, UPDDR, etc. is connected merely by selecting a cell type and laying out the selected type in the I/O area. Further, the optimal repeater circuit is selected and automatic layout and wiring are carried out for signal lines associated with the test. This structure is also one of the features of the embodiment.

Figure 8:
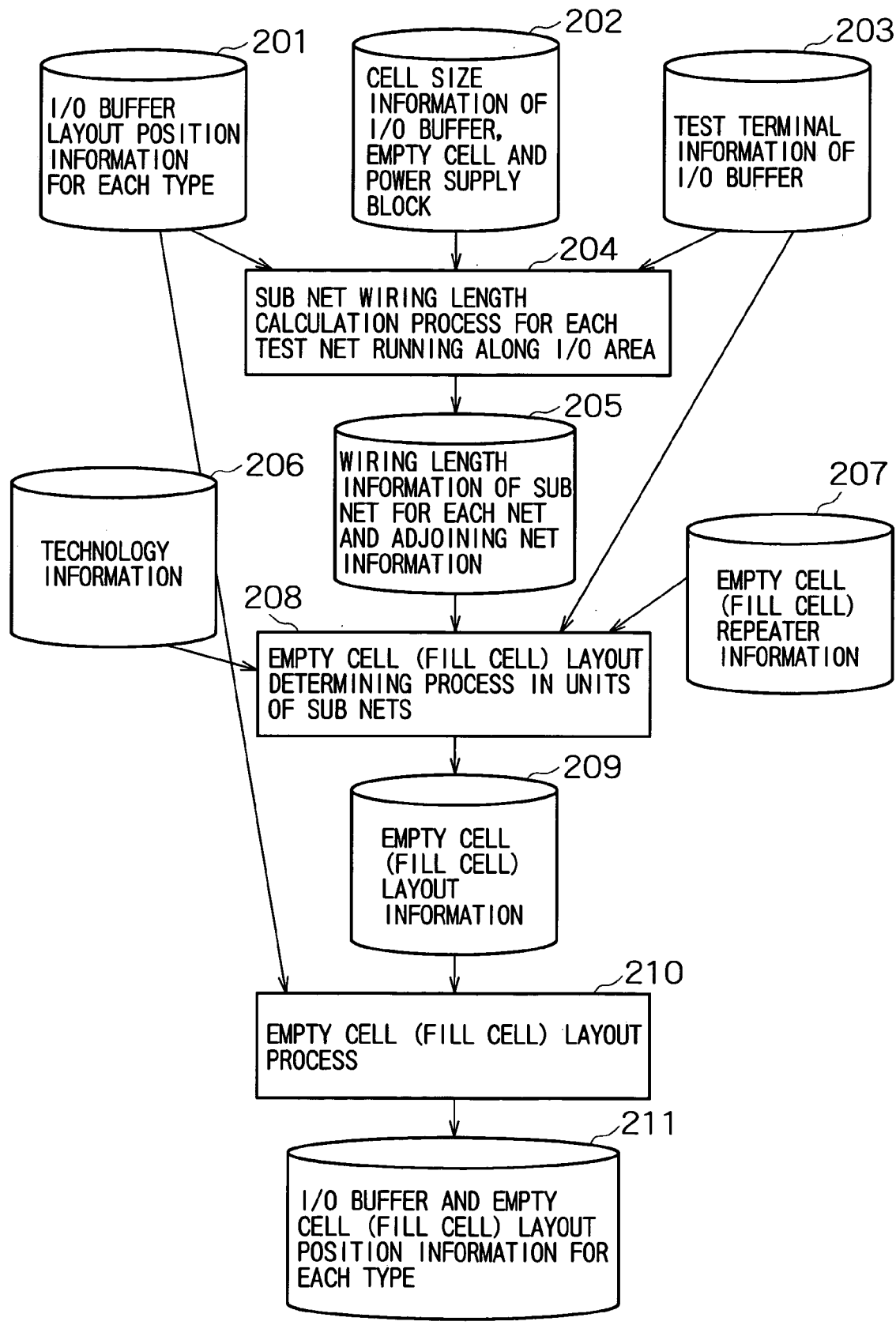
FIG. 8 is a diagram illustrating a system process flow according to the embodiment.

The present invention also provides a CAD (Computer Aided Design) apparatus or an EDA (Electronic Design Automation) apparatus. FIG. 8 is a diagram illustrating the process flow of a design automation apparatus (EDA system) according to the embodiment. The design automation apparatus has files(a memory unit) which respectively store I/O cell layout position information (file 201), I/O cell size information (file 202), I/O cell test terminal information (file 203), technology information including design information (file 206), and information on a repeater circuit to be laid out in an empty cell (file 207) for each type of I/O cells on a chip which are to be connected to external pins, a computing section which computes a wiring length of a sub net between adjoining I/O cells for test signals (called "test net") to be connected to an area for layout of I/O cells (called "I/O area") at a peripheral portion of a chip by referring to the I/O cell layout position information, I/O cell size information and I/O cell test terminal information in the memory unit and outputs the wiring length (sub net wiring length calculation process 204), a linear circuit simulator, such as SPICE, a determining section which computes information at least on a wiring resistance and a capacitance for the sub net, causes the linear circuit simulator to execute circuit simulation to acquire a wiring delay of the sub net and waveform depression at an end of the sub net, and determines an optimal repeater circuit to be inserted in an empty cell where the sub net passes, based on the information on the repeater circuit stored in the memory unit in case where the wiring delay and waveform depression concerning the sub net are out of a predetermined range of allowance defined in the technology information (process 208 for determining empty cell layout positions in units of sub nets), and a layout section 210 which lays out an empty cell including the determined repeater circuit in the I/O area. The determining section (208) determines the repeater circuit performs control to execute circuit simulation for a sub net divided by insertion of a selected repeater circuit to acquire a wiring delay and waveform depression concerning the divided sub net, determine whether the wiring delay and waveform depression concerning the divided sub net fall within the range of allowance defined in the technology information or not, and search for an optical repeater circuit by selecting another repeater circuit or further dividing the sub net in case where the wiring delay and waveform depression do not fall within the range of allowance. The functions and processes of those means should preferably be accomplished a program which is run by a computer, such as an EWS (Engineering Work Station), which constitutes a CAD system (DA system).

Figure 10:
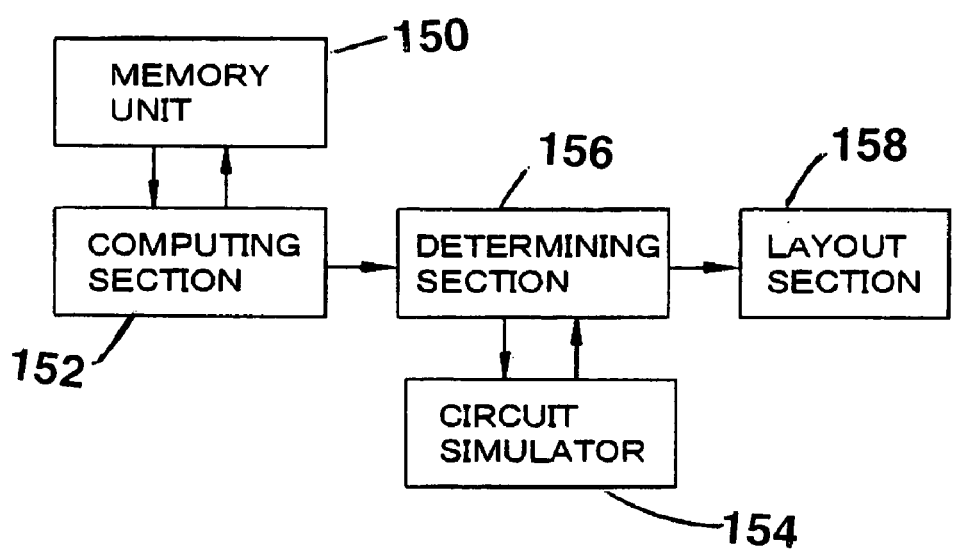
FIG. 10 is a diagram showing an embodiment of the design automation apparatus of the present invention.

As shown in FIG. 10, the design automation apparatus may include a memory unit 150 which stores I/O cell layout position information, I/O cell size information, I/O cell test terminal information, technology information including design information, and information on a repeater circuit to be laid out in an empty cell for each type of I/O cell on a chip which are to be connected to external pins; a computing section 152 which computes a wiring length of a sub net between adjoining I/O cells for test signals (called "test net") to be connected to an area for layout of I/O cells (called "I/O area") at a peripheral portion of a chip by referring to the I/O cell layout position information, I/O cell size information and I/O cell test terminal information in the memory unit and outputs the wiring length; a circuit simulator 154; a determining section 156 which computes information at least on a wiring resistance and a capacitance for the sub net, causes the circuit simulator to execute circuit simulation to acquire a wiring delay of the sub net and waveform depression at an end of the sub net, and determines an optimal repeater circuit to be inserted in an empty cell where the sub net passes, based on the information on the repeater circuit stored in the memory unit in case where the wiring delay and waveform depression concerning the sub net are out of a predetermined range of allowance defined in the technology information; and a layout section 158 which lays out an empty cell including the determined repeater circuit in the I/O area.

In FIG. 8, the file 201 includes layout position information of individual cells in the I/O area, such as an I/O buffer, a power supply cell and an empty cell, as I/O cell layout position information for each type.

The file 202 includes size information (X, Y information) as cell size information of the I/O cells, empty cells and the power supply block.

The file 203 includes layout position information of the intracell test terminal of the I/O buffer and information, such as the input terminal capacitance, wiring capacitance of a connection gate of the test terminal and an output impedance, as test terminal information each I/O cell has.

The file 206 includes, as technology information, power supply information of types of I/O cells and a delay value and waveform depression, which should fall within the range of allowance in each test net. The technology information includes the layer name of the layout, the layer number, the wiring width, the design rule for the wiring pitch, the capacitance parameter, etc. as semiconductor fabrication information.

The file 207 includes, as empty cell (fill cell) repeater information, information of a repeater for each net laid out beforehand in an empty cell (drive performance, output impedance, the input terminal capacitance of the repeater, the wiring capacitance, etc.)

The information stored in those files are stored in advance in a memory unit as cell library information in a finished design process for the device.

The sub net wiring length calculation process 204 determines the layout of empty cells in the units of sub nets. More specifically, information on the layout positions, the cell sizes and the test terminals of I/O cells from the files 201, 202 and 203, calculates the wiring lengths (including the distance between the wiring layer and the substrate) of a sub net between adjoining cells in each test net (signal wirings for SC1, SC2, SCN, etc.), and outputs the adjoining net information to the file 205.

In the process 208 for determining empty cell layout positions in the units of sub nets, the technology information is acquired from the file 206, the test terminal information of an I/O cell is acquired from the file 203, empty cell repeater information is acquired from the file 207, the wiring length of a sub net and adjoining net information are acquired from the file 20, the wiring resistance R and capacitance C of each of sub nets stored in the file 205, and net information (net list information, analysis type command, probe target node, input waveform information) to be input to the circuit simulator, such as SPICE, is automatically generated based on output impedance information, input terminal capacitance information and power supply voltage information of the buffer (23 in FIG. 3) in one I/O cell which drives the sub net. Based on the net information, the circuit simulator executes simulation to acquire the wiring delay and waveform depression at the end of a sub net.

Figure 9:
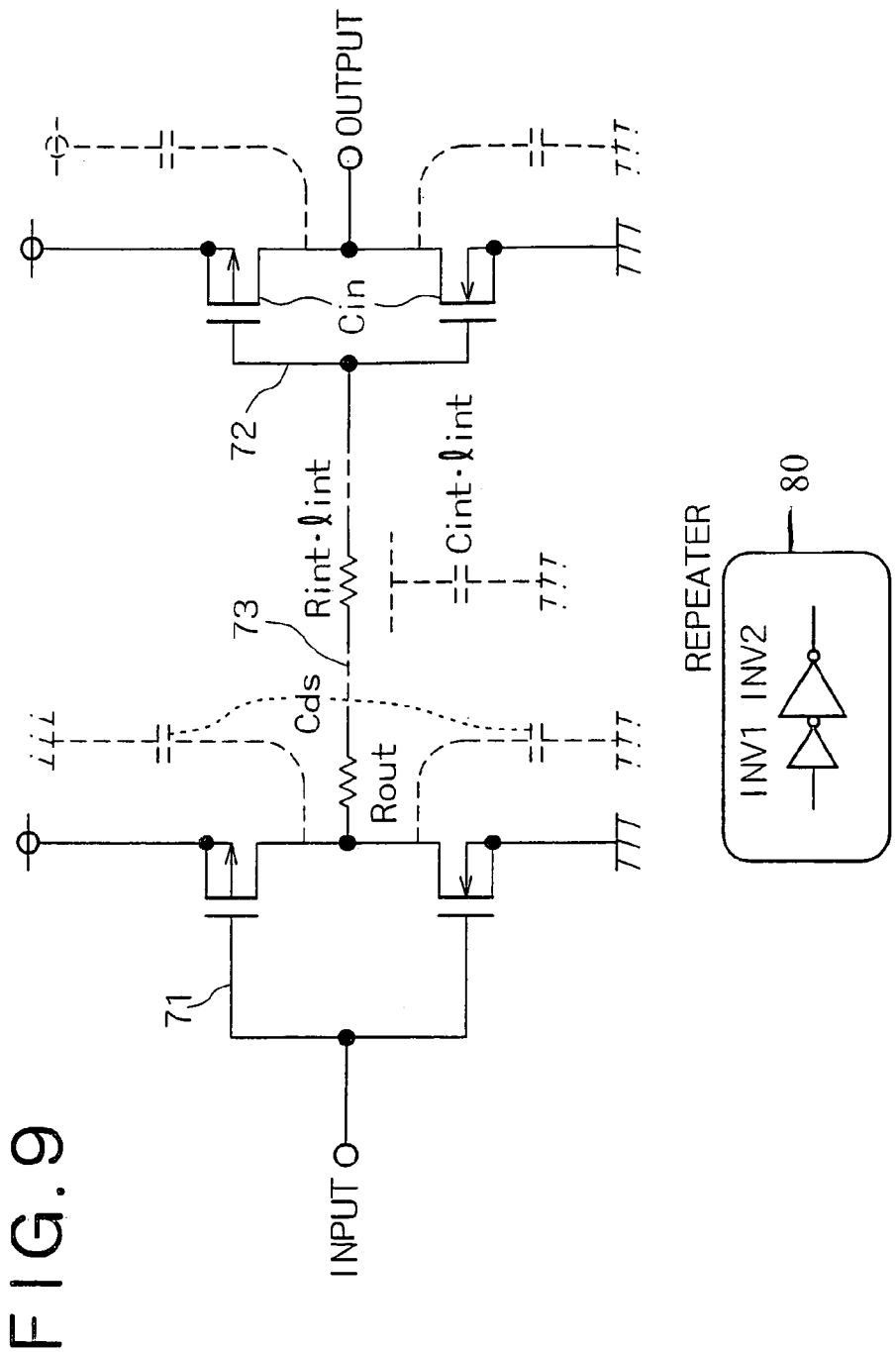
FIG. 9 is a diagram showing one example of a net list for analysis for selecting a repeater.

The circuit simulation is briefly discussed below. As shown in FIG. 9 (based on FIG. 2 in Patent Document 2), for example, the net list of a simulation target circuit is generated in such a way that, in one I/O cell, a CMOS inverter 71 which constitutes the output stage of the buffer that enables the test signal wiring has an output resistance Rout and a drain intersubstrate capacitance Cds, and in an adjoining I/O cell, a CMOS inverter 72 which serves as a receiver to receive a signal has an input gate capacitance Cin and a wiring 73 of the sub net has a resistance Rint×Lint and a wiring capacitance Cint×Lint according to the present invention a wiring length Lint. Then, with a pulse waveform input to the buffer 71 which enables the sub net wiring 73, transient analysis is carried out to analyze the rising (or falling) waveform of a signal waveform at the end portion of the sub net.

In case where the result of the transient analysis in the circuit simulation shows that the delay and waveform depression at the end of the sub net (the input terminal of the CMOS inverter 72) satisfy a predetermined design condition defined in the technology information, no repeater circuit is inserted in an empty cell even if the empty cell is located between adjoining I/O cells.

In case where the delay and waveform depression are off the range of the predetermined design condition, on the other hand, division of the sub net 73 is executed and a repeater circuit 80 comprised of two inverters is inserted in the wiring 73. That is, in case where an empty cell is located between adjoining I/O cells, a single repeater circuit is selected from the empty cell repeater information 207 and inserted in the empty cell. Then, circuit simulation is performed again on a divided sub net generated through division by the inserted repeater circuit to thereby acquire the wiring delay of the divided sub net and waveform depression at the end. In case where the original sub net is divided into two sub nets, for example, the inverter 72 in FIG. 9 corresponds to an input-stage inverter INV1 of the repeater circuit in the first divided sub net, and the inverter 71 in FIG. 9 corresponds to an output-stage inverter INV2 of the repeater circuit in the second divided sub net. The sub net wiring 73 corresponds to a divided sub net.

In case where the result of the circuit simulation for each divided sub net shows that the wiring delay and waveform depression at the end, both concerning the divided sub net, satisfy the predetermined design condition, the layout of the selected repeater circuit is decided. In case where the wiring delay and waveform depression at the end, both concerning the divided sub net, are out of the predetermined range of allowance, on the other hand, a repeater circuit having high drive performance (large size) is inserted and analysis in circuit simulation is carried out again. In case where there are plural (multiple) empty cells consecutively present between adjoining I/O cells, the original sub net may be further divided into four or eight sub nets by dispersing repeater circuits with intermediate drive performance in plural empty cells and adjustment may be made to meet the desired characteristics. Delay adjustment of a test signal corresponding to a device to be designed is automatically performed in the above-described manner.

In case where a buffer is placed between two points apart from each other by a certain distance and a signal is transferred between the two points, there are a structure where a single large buffer is placed between the two points and a structure where plural buffers of the adequate size are placed between the two points. The former case has a shortcoming that the delay time generally decreases, but if the wiring length exceeds a certain limit, the delay time increases. The latter case can provide the condition that minimizes the delay time and facilitates signal delay adjustment while it should consider the size and quantity of the buffers. The method described in Japanese Patent Laid-Open No. 2001-290854 may be employed which can determine the optimal circuit structure uniquely and can facilitate the optimal design to minimize the delay time of the signal propagation circuit by independently determining the size and number of the inverters or buffers to be inserted based on the latter scheme. The use of the method eliminates the need for repetitive execution of circuit simulation.

The layout information of the decided empty cell is then stored in a file 209 and a process 210 of laying out empty cells in the I/O area is carried out.

Layout information 211 of the I/O area is acquired based on the layout information of I/O cells and empty cells.

Although the present invention has been discussed referring to the embodiment, the present invention is not limited to the structure of the embodiment and should naturally include various modifications and changes within the spirit or scope of the present invention that would be anticipated by those skilled in the art.

What is claimed is:

1. A semiconductor integrated circuit device comprising:
   plural I/O cells provided in an I/O area in a peripheral portion of a chip, said I/O cells being arranged to be connected to external pins;
   signal wirings which transfer a test signal to said I/O cells and are provided in said I/O area in a layout direction of said I/O cells; and
   plural repeater circuits that are each in a different part of said I/O area that does not include one of said I/O cells and through which said signal wirings run, each of said repeater circuits receiving and outputting said test signal and being optimized in electrical characteristics for a delay condition for a location thereof.

2. The semiconductor integrated circuit device according to claim 1, wherein said I/O cells include a boundary-scan register circuit and said signal wirings include a wiring for a signal to be supplied to said boundary-scan register circuit.

3. The semiconductor integrated circuit device according to claim 2, wherein said I/O cells include a scan flip-flop circuit for a scan path test and said signal wirings include a wiring for a scan path test signal to be supplied to said scan flip-flop circuit.

4. A design automation apparatus for a semiconductor integrated circuit, comprising:

a memory unit which stores I/O cell layout position information, I/O cell size information, I/O cell test terminal information, technology information including design information, and information on a repeater circuit to be laid out in an empty cell for each type of I/O cell on a chip which are to be connected to external pins;

a computing section which computes a wiring length of a sub net between adjoining I/O cells for test signals (called "test net") to be connected to an area for layout of I/O cells (called "I/O area") at a peripheral portion of a chip by referring to said I/O cell layout position information, I/O cell size information and I/O cell test terminal information in said memory unit and outputs said wiring length;

a circuit simulator;

a determining section which computes information at least on a wiring resistance and a capacitance for said sub net, causes said circuit simulator to execute circuit simulation to acquire a wiring delay of said sub net and waveform depression at an end of said sub net, and determines an optimal repeater circuit to be inserted in an empty cell where said sub net passes, based on said information on said repeater circuit stored in said memory unit in case where said wiring delay and waveform depression concerning said sub net are out of a predetermined range of allowance defined in said technology information; and a layout section which lays out an empty cell including said determined repeater circuit in said I/O area.

5. The design automation apparatus according to claim 4, wherein said determining section which determines a repeater circuit includes a control section which executes a circuit simulation for a sub net divided by insertion of a selected repeater circuit to acquire a wiring delay and waveform depression concerning said divided sub net, determines whether said wiring delay and waveform depression concerning said divided sub net fall within said range of allowance defined in said technology information or not, and searches for an optimal repeater circuit by selecting another repeater circuit or further dividing said sub net in case where said wiring delay and waveform depression do not fall within said range of allowance.

6. A design automation method for a semiconductor integrated circuit using a computer having a memory unit which stores I/O cell layout position information, I/O cell size information, I/O cell test terminal information, technology information including design information, and information on a repeater circuit to be laid out in an empty cell for each type of I/O cell on a chip which are to be connected to external pins, said method comprising the steps of:

computing a wiring length of a sub net between adjoining I/O cells for test signals (called "test net") to be connected to an area for layout of I/O cells (called "I/O area") at a peripheral portion of a chip by referring to said I/O cell layout position information, I/O cell size information and I/O cell test terminal information in said memory unit and outputting said wiring length;

computing information at least on a wiring resistance and a capacitance for said sub net, causing a circuit simulator to execute circuit simulation to acquire a wiring delay of said sub net and waveform depression at an end of said sub net;

determining an optimal repeater circuit to be inserted in an empty cell where said sub net passes, based on said information on said repeater circuit stored in said memory unit in case where said wiring delay and waveform depression concerning said sub net are out of a predetermined range of allowance defined in said technology information; and laying out an empty cell including said determined repeater circuit in said I/O area.

7. The design automation method according to claim 6, wherein said step of determining a repeater circuit includes the steps of:

performing control in such a way as to execute circuit simulation for a sub net divided by insertion of a selected repeater circuit to acquire a wiring delay and waveform depression concerning said divided sub net; and determining whether said wiring delay and waveform depression concerning said divided sub net fall within said range of allowance defined in said technology information or not, and searching for an optimal repeater circuit by selecting another repeater circuit or further dividing said sub net in case where said wiring delay and waveform depression do not fall within said range of allowance.

* * * * *